US011431324B1

(12) United States Patent
Finlinson et al.

(10) Patent No.: US 11,431,324 B1
(45) Date of Patent: Aug. 30, 2022

(54) BANDGAP CIRCUIT WITH BETA SPREAD REDUCTION

(71) Applicant: Apple Inc., Cupertino, CA (US)

(72) Inventors: Craig P. Finlinson, Solana Beach, CA (US); Mazen S. Soliman, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/412,215

(22) Filed: Aug. 25, 2021

(51) Int. Cl.
*G05F 1/56* (2006.01)
*H03K 3/011* (2006.01)

(52) U.S. Cl.
CPC .............. *H03K 3/011* (2013.01); *G05F 1/56* (2013.01)

(58) Field of Classification Search
CPC ...................................... G05F 3/222
See application file for complete search history.

(56) References Cited

U.S. PATENT DOCUMENTS

| 6,183,131 | B1 * | 2/2001 | Holloway | ................. G01K 7/21 |
| | | | | 327/512 |
| 6,323,732 | B1 | 11/2001 | Angell et al. | |
| 7,331,708 | B2 * | 2/2008 | Blom | ........................ G01K 7/01 |
| | | | | 327/513 |
| 7,446,598 | B2 * | 11/2008 | Pertijs | ..................... G01K 7/015 |
| | | | | 327/512 |
| 7,453,252 | B1 * | 11/2008 | Megaw | ...................... G05F 3/30 |
| | | | | 323/313 |
| 7,456,679 | B2 * | 11/2008 | Pigott | ........................ G05F 3/30 |
| | | | | 323/313 |
| 8,471,625 | B1 * | 6/2013 | Zhou | ........................ G05F 3/30 |
| | | | | 327/539 |
| 8,531,235 | B1 * | 9/2013 | Zonte | ........................ G05F 3/30 |
| | | | | 327/512 |
| 8,878,597 | B2 * | 11/2014 | Lang | ........................ G01K 7/01 |
| | | | | 327/512 |
| 9,141,124 | B1 * | 9/2015 | Nien | ......................... G05F 3/30 |
| 9,568,929 | B2 | 2/2017 | Eberlein | |
| 9,595,953 | B2 | 3/2017 | Mahant Shetti et al. | |
| 9,727,074 | B1 * | 8/2017 | Terryn | ...................... G05F 3/30 |
| 9,811,104 | B2 * | 11/2017 | Doorenbos | ............... G05F 3/30 |
| 9,933,797 | B1 * | 4/2018 | Lebon | ...................... G05F 1/468 |
| 10,310,539 | B2 | 6/2019 | Marinca | |
| 10,605,676 | B2 * | 3/2020 | Yousefzadeh | ......... G01K 15/005 |
| 11,068,011 | B2 * | 7/2021 | Tai | ............................. G05F 3/26 |
| 2015/0117495 | A1 * | 4/2015 | Tiruvuru | ................... G01K 7/01 |
| | | | | 374/178 |

* cited by examiner

Primary Examiner — Thomas J. Hiltunen
(74) Attorney, Agent, or Firm — Kowert, Hood, Munyon, Rankin & Goetzel, P.C.; Erik A. Heter; Dean M. Munyon

(57) ABSTRACT

A bandgap circuit is disclosed. The bandgap circuit includes a current source configured to generate, using a bias voltage, a first current and a second current, a first bipolar device configured to sink the first current, and a second bipolar device configured to sink the second current via a bias resistor. The bandgap circuit further includes an amplifier circuit configured to generate the bias voltage using a first voltage drop across the first bipolar device and a second voltage drop across the series combination of the bias resistor and the second bipolar device. A compensation circuit is also included, where the compensation circuit is configured to adjust, based on a value of the bias resistor, a base current of the second bipolar device.

20 Claims, 6 Drawing Sheets

BANDGAP CIRCUIT WITH BETA SPREAD REDUCTION

BACKGROUND

Technical Field

This disclosure is directed to electronic circuits, and more particularly, to circuits for sensing a temperature.

Description of the Related Art

Bandgap circuits are used in a wide variety of applications in integrated circuits (ICs). Such circuits may be used in applications such as reference voltage generation for voltage regulators, bias voltage generation, and so on. Temperature sensing is another application of bandgap circuits. Bandgap circuits using bipolar devices may be used to determine a temperature based on a difference between base-emitter voltages of two different devices.

SUMMARY

A bandgap circuit is disclosed. In one embodiment, a bandgap circuit includes a current source configured to generate, using a bias voltage, a first current and a second current, a first bipolar device configured to sink the first current, and a second bipolar device configured to sink the second current via a bias resistor. The bandgap circuit further includes an amplifier circuit configured to generate the bias voltage using a first voltage drop across the first bipolar device and a second voltage drop across the series combination of the bias resistor and the second bipolar device. A compensation circuit is also included, where the compensation circuit is configured to adjust, based on a value of the bias resistor, a base current of the second bipolar device.

In one embodiment, the bandgap circuit is used to implement a $\Delta Vbe$-type temperature sensor. The compensation circuit may be used to control the effect of Beta spread between first and second bipolar devices of the temperature sensor. This compensation is intended for situations where BJT's are being operated with significant recombination base current and BJT's that may also have a low overall Beta.

In one embodiment, implementation of the compensation circuit may include a resistor electrically coupled between the base terminal of the second bipolar device and a ground terminal. The bias resistor is electrically coupled between the emitter of the second bipolar device and a non-inverting input of the amplifier. The current through the base of the second bipolar device, representing the beta spread with temperature, may be controlled based on a ratio of resistances of the bias resistor to the compensation circuit resistor.

BRIEF DESCRIPTION OF THE DRAWINGS

The following detailed description makes reference to the accompanying drawings, which are now briefly described.

DETAILED DESCRIPTION OF EMBODIMENTS

Figure 1:
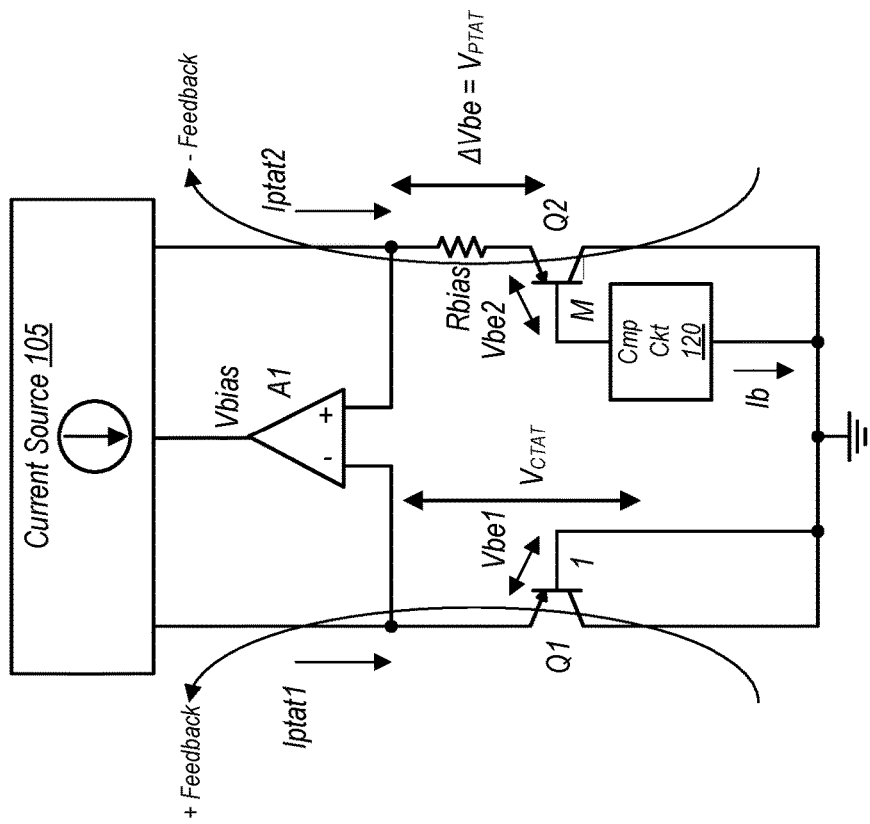
FIG. 1 is a diagram of one embodiment of a bandgap PTAT Core circuit.

Bandgap circuits are widely used in electronics for various applications, including the generation of reference voltages as well as for temperature sensing. An essential building block of the bandgap circuit is the $\Delta Vbe$ core circuit, which generates the PTAT current. A proportional to absolute temperature (PTAT) Core circuit generates a voltage based on a difference between base-emitter voltages of two different bipolar transistors.

In modern CMOS (complementary metal oxide semiconductor) processes, there are intrinsic bipolar transistors that exist within the same areas as the FETs (field effect transistors). For example, a p-well of a FET may serve as an emitter of a bipolar transistor, an n-well may serve as its base, and the p-substrate may serve as the collector to form a PNP bipolar transistor. Because of these intrinsic bipolar transistors, $\Delta Vbe$ PTAT Cores and bandgap circuits may be implemented using CMOS processes. Temperature sensing is a common application of $\Delta Vbe$ PTAT Cores.

Despite the ability to use intrinsic bipolar transistors in CMOS processes, the characteristics of these devices are a secondary concern to the characteristics of the FETs. Accordingly, as feature sizes have shrunk, problems with $\Delta Vbe$ PTAT Cores and Bandgap circuits have arisen as their characteristics are difficult to control in such circumstances. A particular characteristic of bipolar transistors that has become more difficult to control is Beta. Beta of a bipolar transistor may be defined as a factor of proportionality between the base and collector current in a bipolar transistor when it is in a forward conduction mode. In modern CMOS processes, Beta is often very low, with a narrow range of useful bias current. Limited at one end by High Injection and IR drop, and at the low current end by the presence of unwanted and highly variable Base Recombination current. There is therefore normally a significant spread of beta in the bipolar transistors due to base recombination. This makes accurate bandgap voltage generation (and thus, accurate temperature sensing) more difficult to achieve.

When suffering larger base recombination, the two bipolar transistors in the PTAT Core circuit no longer exhibit the same Beta, as they inherently operate at different bias conditions. This combined with generally very low Beta introduces a term in the PTAT current generation that depends on the value of the Base recombination current which is a function of both process and temperature. With matched Betas, as is often assumed to be the case with high quality BJT's, this component becomes less significant, but with modern process nodes and poor quality parasitic BJT's this recombination current is significant.

The present disclosure contemplates compensation circuitry added to adjust a value of a PTAT Core current to compensate the effect of the variable recombination base current. More particularly, the present disclosure contemplates a compensation technique to sense fluctuations of a bipolar transistor base current, and uses negative feedback to regulate these fluctuations into a PTAT current. This technique may be used to largely cancel out gradient spread in, e.g., the expression of temperature/bandgap voltage for, e.g., a $\Delta Vbe$ temperature sensor, where $$T = \frac{c1\Delta Vbe}{c2Vbe} \text{ or } T = \frac{(c1\Delta Vbe - c2Vbe)}{(c3\Delta Vbe + c4Vbe)},$$

where ΔVbe is the delta (difference) in the base-emitter voltages, Vbe is the base emitter voltage, and c1-c4 are arbitrary constants.

In various embodiments, the compensation circuit may be implemented using passive or active circuitry. In one particular embodiment, the compensation circuitry may be a resistor coupled between ground and a base terminal of a bipolar transistor, with the emitter terminal being coupled to a bias resistor that is in turn coupled to an amplifier input. The resistor may be of a substantially fixed value, or may be programmable/variable. Embodiments in which the compensation circuitry is active (e.g., using a transistor, a current source, etc.) are also possible and contemplated. The presence of the compensation circuit may be used to control/adjust a value of base current feedback to the loop from the correspondingly coupled bipolar transistor, and may thus effectively cancel out any beta spread between bipolar device pairs used in a bandgap/temperature sensing circuit.

Various embodiments will now be discussed in further detail. The discussion begins with focus on a basic embodiment of a bandgap circuit with a compensation circuit in accordance with the above. An example of a bandgap circuit with a resistive compensation circuit is then discussed followed by a temperature sensor example. Discussions focusing on a method for operation of a bandgap circuit and an example system then follow.

PTAT Core Circuit with Compensation:

FIG. 1 is a schematic diagram of one embodiment of a bandgap PTAT Core circuit having a compensation circuit to control the base current of one of the bipolar devices. Circuit 100 may be used to generate a bandgap voltage based on a difference between base-emitter voltages of two bipolar devices (Q1 and Q2 in this example) then summing with a CTAT voltage, Vbe. Applications of the circuit include the generation of stable bandgap voltages, as well as temperature sensing in integrated circuits. Circuit 100 in the embodiment shown includes a compensation circuit 120 as described above and in further detail below.

In the embodiment shown, circuit 100 includes a current source 105 from which two currents flow, Iptat1 and Iptat2. These currents are, as their name suggests, PTAT. The current Iptat1 flows into the emitter terminal of bipolar transistor Q1. Meanwhile, the current Iptat2 flows from current source 105, through a bias resistor Rbias, to the emitter terminal of bipolar transistor Q2.

As also shown in FIG. 1, the emitter terminal of Q1 is electrically coupled to an inverting input of amplifier A1. The non-inverting terminal of amplifier A1 is coupled to one terminal of bias resistor Rbias. Amplifier A1 is configured to generate a bias voltage, Vbias based on equalizing the voltages applied to its inverting and non-inverting terminals. This bias voltage is used by the voltage-controlled current source 105 to provide the currents Iptat1 and Iptat2.

Bipolar transistor Q1 includes base and collector terminals that are both electrically coupled to a ground node. During operation, a base-emitter voltage Vbe1 is present between the base and emitter terminals of Q1. The collector of bipolar transistor Q2 is electrically coupled to ground, while its emitter is coupled to one terminal of Rbias. When the circuit is operating, a base-emitter voltage Vbe2 is present between the base and emitter terminals of Q2. A compensation circuit 120 is implemented in the embodiment shown, electrically coupled between the base terminal of Q2 and the ground node. Compensation circuit 120 in the embodiment shown may be used to control/adjust the base current feedback to the non-inverting terminal of A1. This may in turn, for example, aid in freeing Iptat of base current variations between Q1 and Q2 over temperature. Compensation circuit 120 may be implemented in various embodiments using passive and/or active circuitry.

The first and second bipolar transistors Q1 and Q2, respectively, may form first and second feedback loops. The first feedback loop, through Q1, is a positive feedback loop in this embodiment. This feedback loop may effectively provide a reference current, as the base-emitter voltage, Vbe1, does not vary significantly with Iptat during operation of this particular embodiment. The second feedback loop, through Q2, Rbias, and compensation circuit 120, is a negative feedback loop. The impedance in this branch is a function of Vbe(Q2), Rbias and compensation circuit 120. All of Iptat2 flows through Rbias and Ib(Q2) flows through compensation circuit 120. Larger current through compensation circuit 120 causes the base voltage of Q2 to rise and this in turn forces the emitter voltage of Q2 to rise. This reduces the voltage across Rbias and reduces the Iptat current set by the Amplifier A1. The proportion of Rbias to compensation circuit 120 define the strength of the compensating base current on the Iptat loop current.

Both the base and emitter voltage of Q2 may vary a significant amount during operation of the illustrated embodiment. The control of the PTAT current and the base feedback component is predominantly defined in the negative feedback loop. This results from the presence of compensation circuit 120 which will change the PTAT current in response to changes in Q2 base current. More particularly, the presence of compensation circuit 120 affects the proportion of emitter current to base current which allows the amplifier A1 to achieve equilibrium. As Beta drops in Q2 more base current flows and this results in a reduced PTAT current which counteracts the spread of the PTAT current due to varying Beta. Some mathematical details regarding the operation of the circuit will be discussed below in reference to FIG. 2.

Bandgap Circuit with Resistive Compensation Circuit

Figure 2:
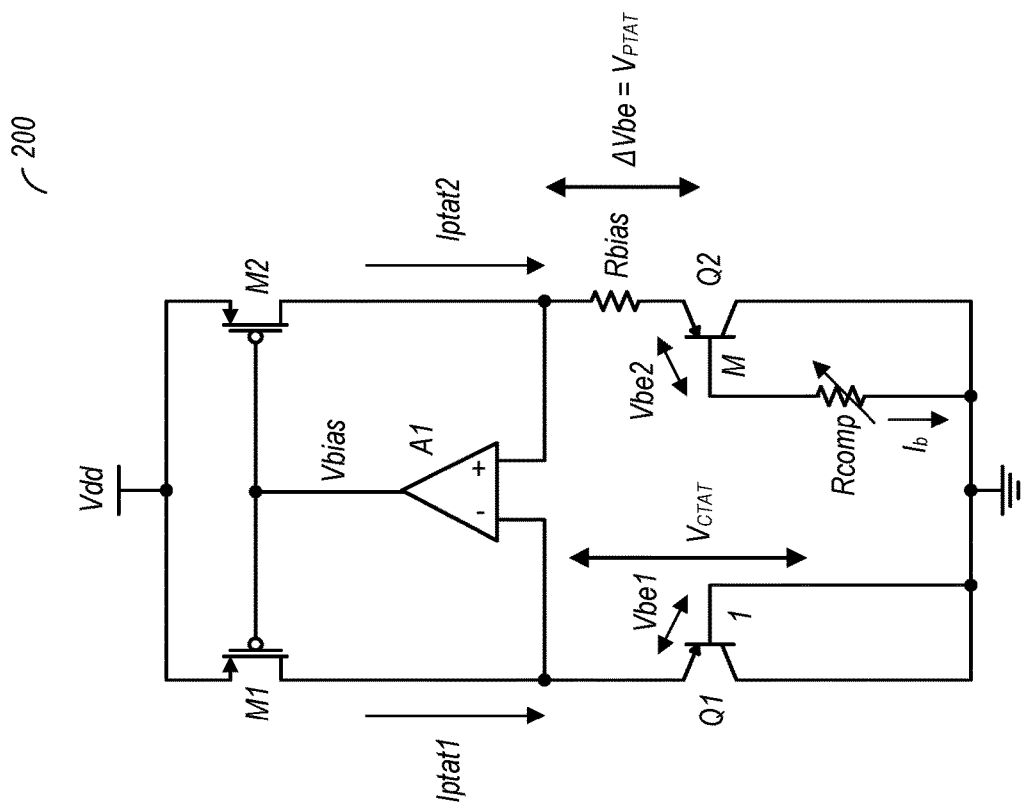
FIG. 2 is a diagram of another embodiment of a bandgap PTAT Core circuit.

FIG. 2 illustrates another embodiment of PTAT Core circuit in accordance with the disclosure. In this embodiment, bandgap circuit 200 includes a current source implemented using PMOS devices M1 and M2, the respective gate terminals of which are coupled to receive the bias voltage, Vbias, from amplifier A1. The first PTAT current, Iptat1, flows from the drain terminal of M1, while Iptat2 flows from the drain terminal of M2.

As in the embodiment discussed above, bandgap circuit 200 includes a positive feedback loop incorporating bipolar transistor Q1 and a negative feedback loop incorporating Q2, Rbias, and compensation circuitry. In this particular embodiment, the compensation circuitry is implemented using a resistor, Rcomp, which may be a variable/programmable resistor as indicated. Embodiments in which Rcomp is a fixed value are also possible and contemplated. The presence of resistor Rcomp in the embodiment shown affects the base voltage of Q2, and thus the currents associated therewith in the loop. Due to the presence of Rcomp, the base current and the base voltage have a relationship such that higher base currents result in correspondingly higher base voltages. This in turn raises the voltage on the emitter of Q2. As a result of this arrangement, the current through the emitter of Q2 and the spread of this current in response to beta over temperature are both thus dependent on the resistance ratio of the compensation resistor Rcomp and the bias resistor Rbias.

The ability to control the spread of beta over temperature may thus allow for more accurate generation of PTAT currents bandgap voltages to desired values. In temperature sensing applications, this corresponds to more accurate temperature readings. Techniques such as polynomial fitting can eliminate some of the expected linearity inaccuracy. However, controlling beta behavior of intrinsic bipolar transistors in CMOS processes among a large number of parts in volume production is difficult. In such CMOS processes, the emphasis is typically placed on the characteristics of the MOS devices, particularly as process sizes have become smaller. As a result, bandgap and temperature sensing circuits implemented in such processes without the compensation described herein may suffer from beta spread that can, e.g., affect the accuracy of temperature sensors implemented using various embodiments of the circuits described herein.

The compensation resistor shown in FIG. 2 (and more generally, compensation circuitry within the scope of this disclosure) may implement a compensation technique to sense perturbation of the base current. In the embodiment shown in FIG. 2, using a resistor to implement the compensation circuitry, the circuit becomes self-compensating by placing the compensation resistor in the negative feedback loop (which passes through the non-inverting terminal of the amplifier). The negative feedback provided in the corresponding feedback loop may then regulate the fluctuation in base current into the PTAT current through that loop in such a manner and proportion to cancel out gradient spread in, e.g., the expression ΔVbe/Vbe. In temperature sensing applications in which the sensed temperature T=ΔVbe/Vbe/T=ΔVbe−Vbe or similar, this can lead to greater accuracy in temperature sensing. An embodiment of a temperature sensing circuit having a compensation circuit is now discussed in further detail.

Figure 3A:
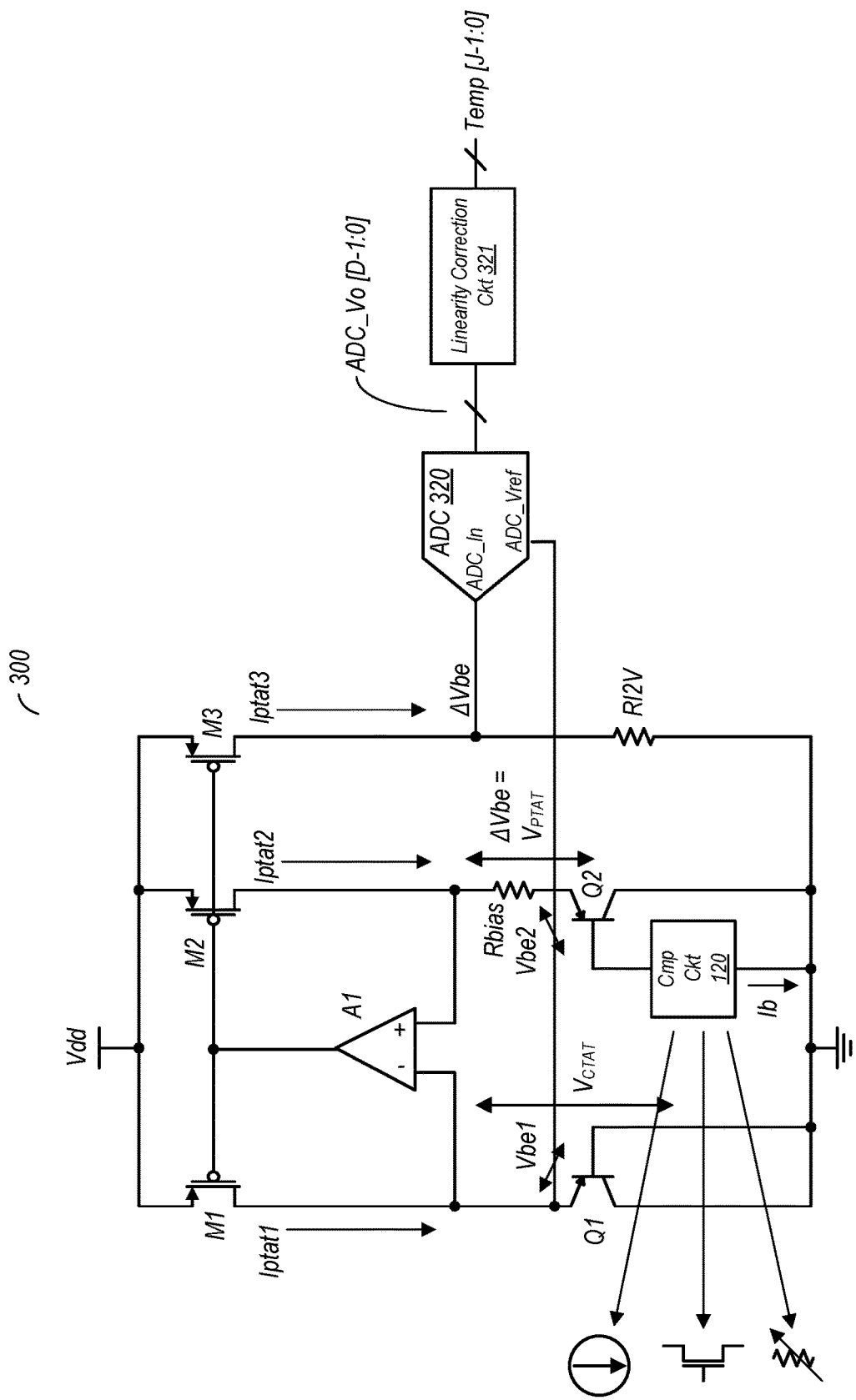
FIG. 3A is a diagram of one embodiment of a temperature sensor circuit implemented using a bandgap PTAT Core circuit.

Temperature Sensor Utilizing Bandgap Circuit with Compensation:

FIG. 3A is a diagram of one embodiment of a temperature sensing circuit implemented using a bandgap PTAT Core circuit in accordance with this disclosure. In the embodiment shown, circuit 300 includes a core circuit similar to those discussed above. The core circuit portion includes a current source comprising transistors M1 and M2, amplifier A1 which generates a bias voltage to drive M1 and M2, bipolar transistors Q1 and Q2, and a bias resistor, Rbias, electrically coupled between the emitter of Q2 and the node coupled to the drain terminal of M2 and the non-inverting input of A1. The circuit also includes a compensation circuit 120, which may be implemented passively as a resistor (variable/programmable or fixed value) in some embodiments, but may be implemented as an active circuit using, e.g., a transistor or a current source (e.g., a voltage controlled current source) in other embodiments.

Temperature sensor 300 in the embedment shown also includes an additional circuit leg, including PMOS transistor M3 (the gate terminal of which is electrically coupled to the output of A1), and a resistor RI2V, which, based on a third current, Iptat3, is used to generate a voltage corresponding to ΔVbe between Q1 and Q2. As the name suggests, Iptat3 is also PTAT.

The ΔVbe is provided as an input to analog-to-digital converter (ADC) 320, which also receives a reference voltage directly from the emitter terminal of Q1. The digital output from ADC 320, ADC_Vo, is a D-bit output (where D is an integer value) provided to linearity correction circuit 321. The linearity correction circuit may apply the digital value to a polynomial, the coefficients of which may be determined during a calibration prior to operation. Executing the polynomial may thus result in a temperature value of J bits, where J is an integer value that may be different from D.

Figure 3B:
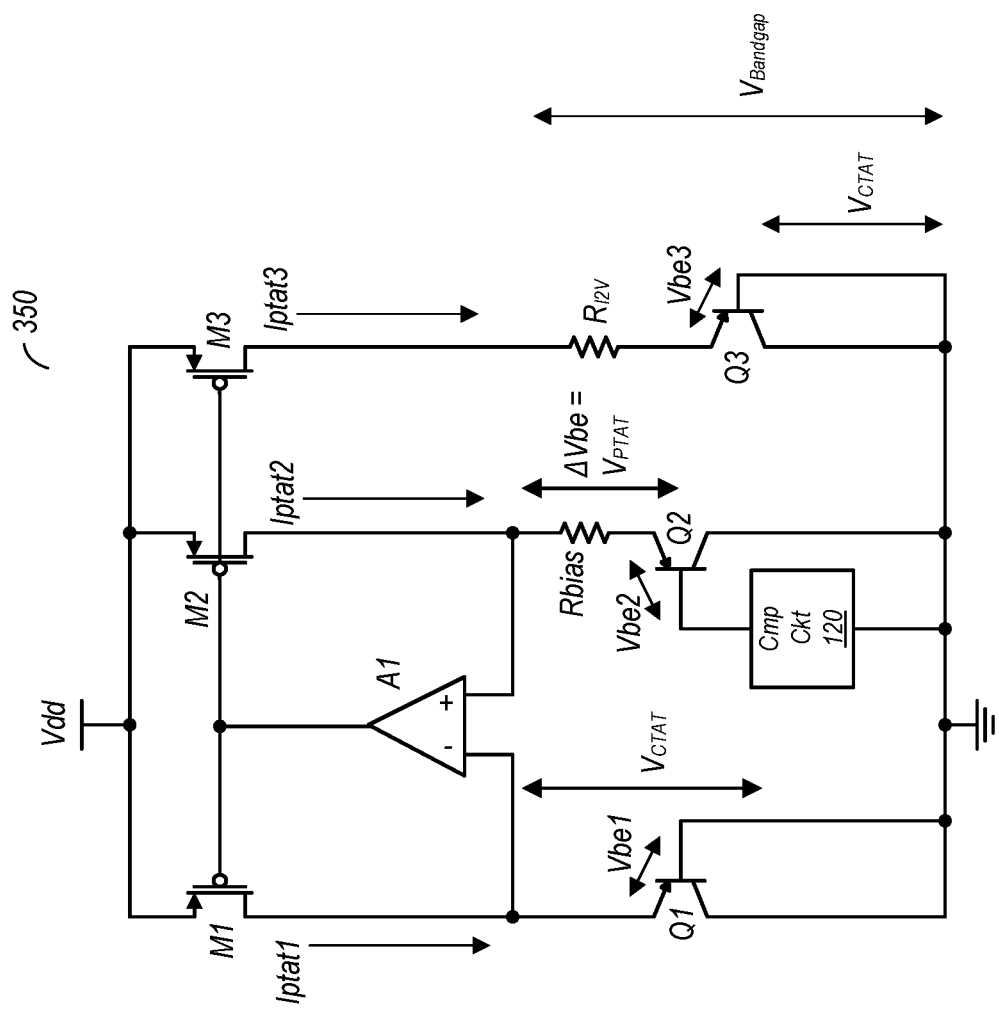
FIG. 3B is a diagram of one embodiment of a bandgap incorporating a compensated PTAT Core circuit.

FIG. 3B is a diagram of one embodiment of a bandgap incorporating a compensated PTAT Core circuit. In the embodiment shown, circuit 350 includes a third circuit branch similar to the PTAT core circuit used to implement temperature sensor 300 of FIG. 3. However, the third circuit branch in this embodiment includes another bipolar transistor Q3. Using the transistor Q3 and resistor $R_{12V}$, a bandgap voltage, $V_{Bandgap}$ is generated. Thus, in addition to the embodiments discussed above that are used as a temperature sensor, the various embodiments of the PTAT core circuit disclosed herein may also be used as bandgap circuits for generating a substantially fixed voltage, and may utilize the compensation discussed above.

It is useful to understand the effect of the addition of compensation on the operation of the circuit as disclosed herein. Equation 1 below represents the ideal operation of a ΔVbe circuit, without compensation and with BJT's operating with recombination current components:

$$\Delta V_{be} = n\frac{kT}{q}\ln(M) \qquad \text{Eq. 1}$$

where n is diode ideality factor, k is Boltzman's constant, T is temperature, q is electron charge, M is the current density ratio between the two bipolar devices.

Without the addition of a compensation circuit (such as the compensation resistor of FIG. 2) and with both base terminals coupled to ground, the feedback loops are self-biasing based on bringing up the PTAT currents on both branches until the equilibrium point is reached. This occurs when a sufficient PTAT current flows through the bias resistor, Rbias, to bridge the difference between the base-emitter voltages of the two bipolar devices. Ideally, with low recombination components and high Betas, the PTAT current through the second device (e.g., Q2) equals the collector current and is matched to that of Q1, which results in an ideal ΔVbe/Vbe characteristic.

However, obtaining the proper device matching is difficult, as noted above, particularly in intrinsic bipolar devices implemented in a CMOS process. Parasitic BJT's in modern nodes include significant proportions of base recombination current, affecting Beta differently in each device (Q1/Q2). Due to their different current densities the effect causes a Delta in their respective Betas and therefore a variable mismatch with process and temperature. Additionally, due to finite and particularly low beta, the base current that needs to be provided along with any collector current may be a significant proportion of the emitter PTAT current, making the Beta mismatch effect significant. The negative feedback loop in the bandgap circuit with a bias resistor such as Rbias sums into equilibrium through this resistor. Thus, any variation in Q1/Q2 base current due to perturbation of beta can alter the PTAT current. If the Beta has a variable temperature coefficient due to spread in the recombination component, the ratio of collector current to base current changes in the bipolar devices and adds a gradient spread component to the base-emitter voltage temperature response and the ΔVbe response, and this is not controllable by a single point calibration. This can be seen in Equation 2:

$$\Delta V_{be} = n\frac{kT}{q}\ln(M) \text{ becomes } \Delta V_{be} = n\frac{kT}{q}\ln\left(M \cdot \frac{\rho(1+\beta_2)}{1+\rho\beta_2}\right) \quad \text{Eq. 2}$$

$$\text{Where } V_{be1} = n\frac{kT}{q}\ln\left(\frac{I_{ptat}}{I_S}\right) \text{ becomes } V_{be1} = n\frac{kT}{q}\ln\left(\frac{I_{ptat}}{I_S}\cdot\frac{\beta_1}{\beta_1+1}\right),$$

and where Is is the bipolar saturation current and $\beta_{1/2}(T)$ is Q1/Q2 beta as a function of temperature.

In the circuit of the present disclosure, compensation is added to the base of the transistor in the negative feedback loop. Using the embodiment of FIG. 2 as an example, the addition of a compensation circuit results in a compensation resistance, Rcomp, between ground the base terminal of the bipolar device in the negative feedback loop. By adding the compensation resistance, when base current increases, it is detected due to the presence of the compensation circuit, the negative feedback loop is driven with a voltage proportional to the increase in the base current as an additional component to the increase in overall emitter current. Similarly, when the base current decreases, the negative feedback loop is driven with a voltage proportional to the decrease in the base current. Thus, when the ratio of base current to collector current changes, the negative feedback loop responds with an opposite change in the corresponding PTAT current (e.g., if the ratio of base to collector current increases, the loop responds with a decrease in PTAT current). The ratio of the resistance of Rcomp to Rbias determines the degree of negative feedback applied to the base current component, and thus the combination of these two resistances, and their ratio, govern operating current in the negative feedback loop. A ratio of zero is equivalent to zero base current sensing, which corresponds to a conventional, uncompensated loop. The particular value of this ratio may be chosen to a value that works best with the beta characteristics of the corresponding manufacturing process. Equation 3 mathematically illustrates the above discussion:

$$\Delta V_{be} = n\frac{kT}{q}\ln\left(M \cdot \frac{\rho(1+\beta_2)}{1+\rho\beta_2}\right)\left(\frac{1+\beta_2}{1+N+\beta_2}\right), \rho = \frac{\beta_1}{\beta_2}, N = \frac{R_{comp}}{R_{bias}} \quad \text{Eq. 3}$$

$$Temp = \frac{\Delta V_{be}}{V_{be}} = \frac{R_{I2V}}{R_{bias}} \times \frac{\ln\left(M \cdot \frac{\rho(1+\beta_2)}{1+\rho\beta_2}\right)}{\ln\left(\frac{I_{ptat}}{I_S}\cdot\frac{\beta(T)}{\beta(T)+1}\right)} \times \frac{1+\beta_2}{1+N+\beta_2},$$

Generally speaking, a compensation circuit may be implemented to control and adjust the base current of the bipolar transistor in the negative feedback loop such that the negative feedback loop responds in accordance with the discussion above. Through this mechanism, the beta spread can be effectively canceled out by choosing a particular ratio of Rcomp to Rbias, irrespective of how Rcomp (and more generally, the compensation circuit) is implemented.

The circuit of the present disclosure may provide a number of advantages over previous ΔVbe bandgap circuits and temperature sensors based thereon. The area consumed by the compensation circuit may be minimized. In the embodiment in which the compensation circuit is implemented with a single resistor, a simple relocation of some resistance may achieve the desired circuit operation. In various embodiments, the compensation circuit adds no additional power consumption to the biasing of the circuit. No additional headroom is required as Q1 still dominantly sets the Quiescent in/out voltages of A1. In its simplest form, the compensation circuit may be implemented using a single resistor, and this resistor may be programmable to achieve the desired resistance ratio per the above discussion. When used as a temperature sensor, the circuit may provide more accurate temperature sensing. The increased accuracy in temperature sensing may allow for more accurate setting of thermal margins and a more suitable temperature guardband. This in turn can allow an integrated circuit (such as a system on a chip, or SoC) to operate with higher performance limits.

It is noted that while the circuits discussed above have been implemented using transistors with particular technologies (MOS transistors and intrinsic), the disclosure is not intended to limit embodiments falling within its scope to these technologies. Thus, in addition to various device types discussed above, the present disclosure also contemplates embodiments that use non-planar devices such as FinFETs, GAAFETs (Gate All Around FETs), among other types, along with any corresponding intrinsic bipolar transistors. Embodiments that incorporate transistor-transistor logic (TTL), are also possible and contemplated. The disclosure further contemplates that technologies that are speculative as of this writing may be used to implement devices in various embodiments of the circuits discussed herein. These technologies include (but are not limited to) graphene devices, carbon nanotube devices, gallium arsenide devices, and so on.

Figure 4:
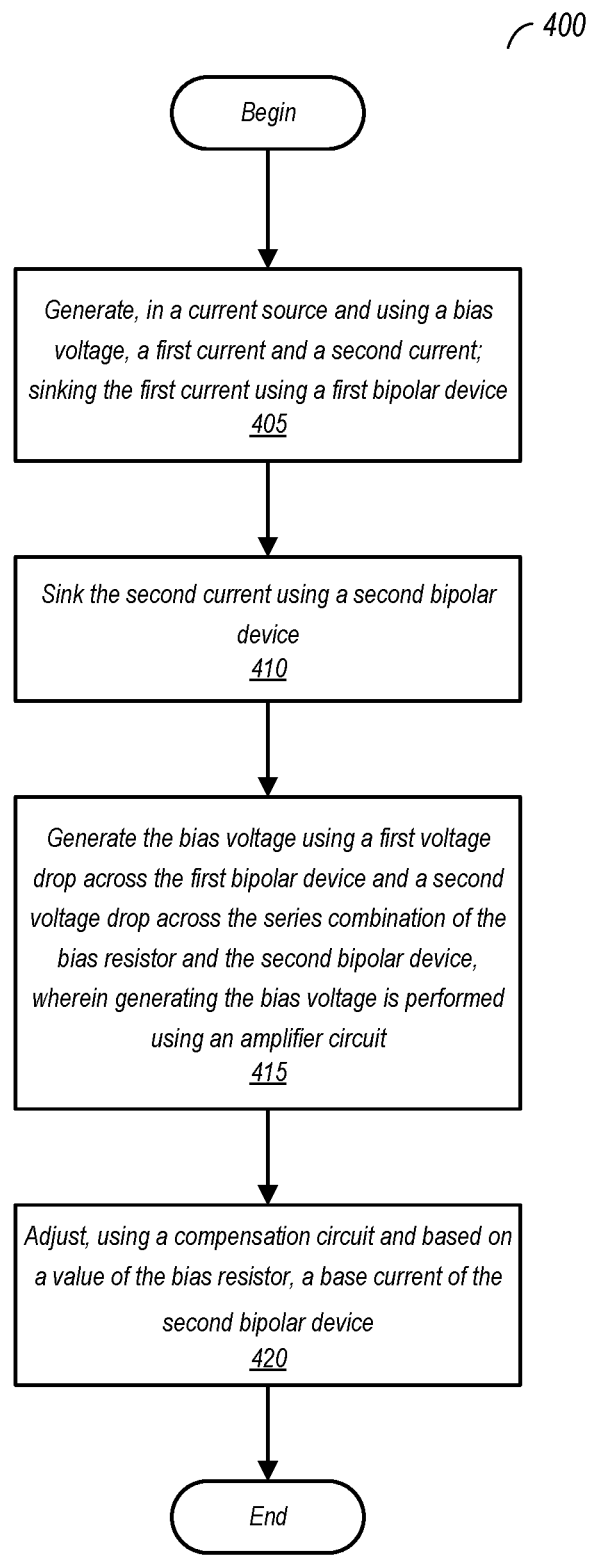
FIG. 4 is a flow diagram illustrating one embodiment of a method for operating a bandgap circuit.

Method for Operating a Bandgap Circuit:

FIG. 4 is a flow diagram of one embodiment of a method for operating a bandgap circuit having a compensation circuit. Method 400 may be carried out by any of the various embodiments of the circuits discussed above. Embodiments of a circuit capable of carrying out Method 400, but not otherwise disclosed herein, are also considered to fall within the scope of this disclosure.

Method 400 includes generating, in a current source and using a bias voltage, a first current and a second current (block 405). The method also includes sinking the first current using a first bipolar device (block 410) and sinking the second current using a second bipolar device (block 415). Based on the above, the method further includes generating the bias voltage using a first voltage drop across the first bipolar device and a second voltage drop across the series combination of the bias resistor and the second bipolar device, wherein generating the bias voltage is performed using an amplifier circuit (block 420). The method further includes adjusting, using a compensation circuit and based on a value of the bias resistor, a base current of the second bipolar device.

In some embodiments, the method includes generating positive feedback in a first feedback loop including the first bipolar device. Such embodiments may also include generating negative feedback in a second feedback loop including the second bipolar device.

In some embodiments, the compensation circuit comprises a compensation resistor, while the method further includes controlling a current through a collector of the second bipolar device based on a ratio of resistance of the bias resistor to a resistance of the compensation resistor. Embodiments of the method may also include controlling, using the compensation circuit, a spread of a beta value of the second bipolar device.

In one embodiment, the method includes generating the first and second currents as proportional to absolute temperature (PTAT) currents based on the bias voltage generated by the amplifier circuit.

Figure 5:
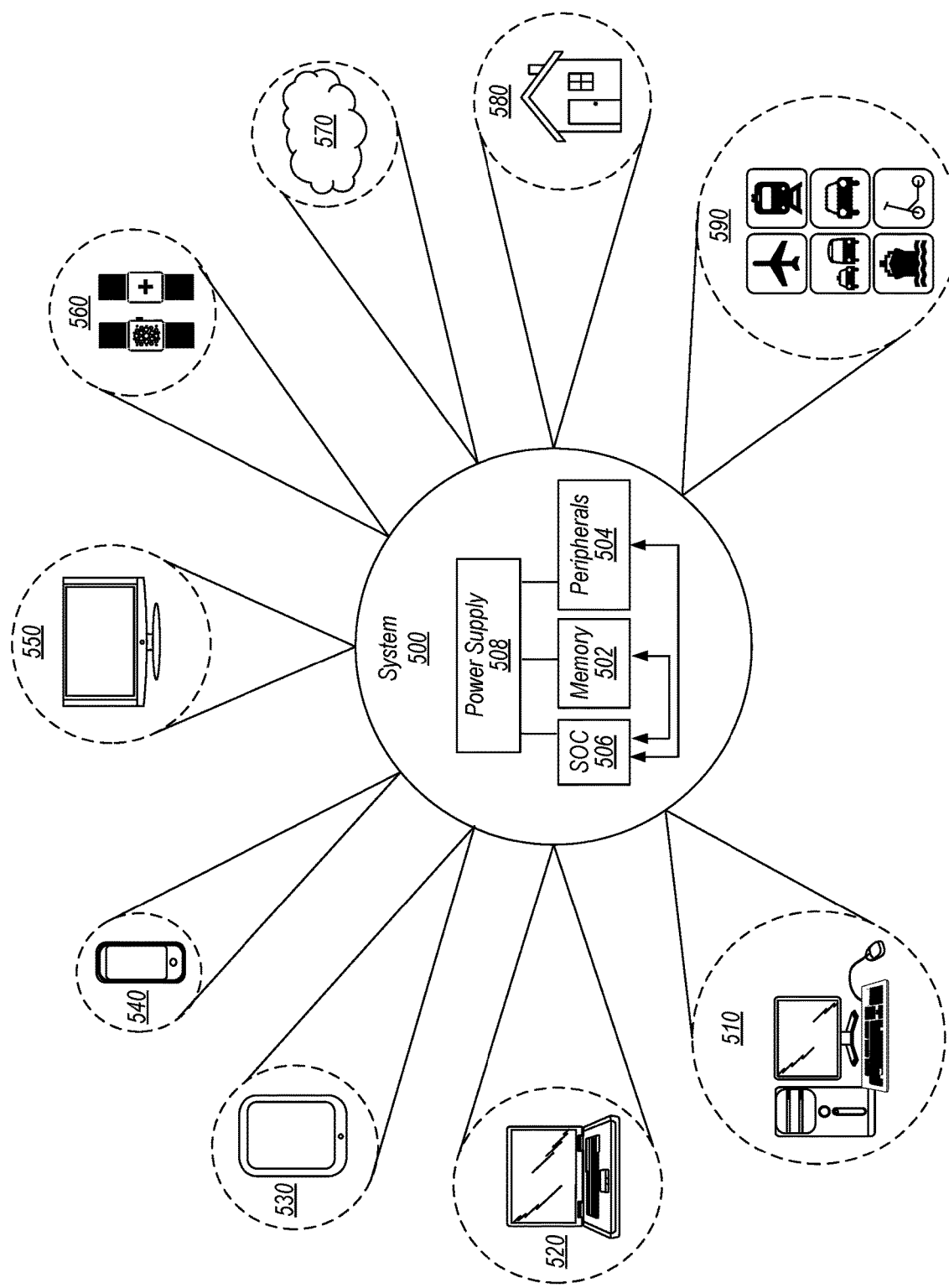
FIG. 5 is a block diagram of an example system.

Example System:

Turning next to FIG. 5, a block diagram of one embodiment of a system 500 is shown that may incorporate and/or otherwise utilize the methods and mechanisms described herein. In the illustrated embodiment, the system 500 includes at least one instance of a system on chip (SoC) 506 which may include multiple types of processing units, such as a central processing unit (CPU), a graphics processing unit (GPU), or otherwise, a communication fabric, and interfaces to memories and input/output devices. In some embodiments, one or more processors in SoC 506 includes multiple execution lanes and an instruction issue queue. In various embodiments, SoC 506 is coupled to external memory 502, peripherals 504, and power supply 508.

A power supply 508 is also provided which supplies the supply voltages to SoC 506 as well as one or more supply voltages to the memory 502 and/or the peripherals 504. In various embodiments, power supply 508 represents a battery (e.g., a rechargeable battery in a smart phone, laptop or tablet computer, or other device). In some embodiments, more than one instance of SoC 506 is included (and more than one external memory 502 is included as well).

The memory 502 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 504 include any desired circuitry, depending on the type of system 500. For example, in one embodiment, peripherals 504 includes devices for various types of wireless communication, such as Wi-Fi, Bluetooth, cellular, global positioning system, etc. In some embodiments, the peripherals 504 also include additional storage, including RAM storage, solid state storage, or disk storage. The peripherals 504 include user interface devices such as a display screen, including touch display screens or multi-touch display screens, keyboard or other input devices, microphones, speakers, etc.

System 500 may include one or more instances of a bandgap circuit as disclosed herein. Instances of the bandgap circuit may be used, for example, to implement temperature sensors, for reference voltage generation, and so on.

As illustrated, system 500 is shown to have application in a wide range of areas. For example, system 500 may be utilized as part of the chips, circuitry, components, etc., of a desktop computer 510, laptop computer 520, tablet computer 530, cellular or mobile phone 540, or television 550 (or set-top box coupled to a television). Also illustrated is a smartwatch and health monitoring device 560. In some embodiments, smartwatch 560 may include a variety of general-purpose computing related functions. For example, smartwatch 560 may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 500 may further be used as part of a cloud-based service(s) 570. For example, the previously mentioned devices, and/or other devices, may access computing resources in the cloud (i.e., remotely located hardware and/or software resources). Still further, system 500 may be utilized in one or more devices of a home other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 5 is the application of system 500 to various modes of transportation. For example, system 500 may be used in the control and/or entertainment systems of aircraft, trains, buses, cars for hire, private automobiles, waterborne vessels from private boats to cruise liners, scooters (for rent or owned), and so on. In various cases, system 500 may be used to provide automated guidance (e.g., self-driving vehicles), general systems control, and otherwise. These any many other embodiments are possible and are contemplated. It is noted that the devices and applications illustrated in FIG. 5 are illustrative only and are not intended to be limiting. Other devices are possible and are contemplated.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure Le something physical). More specifically, this formulation is used to indicate that this structure is arranged to perform the one or more tasks during operation. A structure can be said to be "configured to"

perform some tasks even if the structure is not currently being operated. Thus, an entity, described or recited as being "configured to" perform some tasks refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus, comprising:
a current source configured to generate, using a bias voltage, a first current, a second current, and a third current;
a first bipolar device configured to sink the first current;
a second bipolar device configured to sink the second current via a bias resistor;
a first resistor coupled between the current source and a ground node and configured to generate a difference voltage based on the third current, wherein the difference voltage corresponds to a difference between a base-emitter voltage of the first bipolar device and a base-emitter voltage of the second bipolar device;
an analog-to-digital converter (ADC) configured to convert the difference voltage into a first digital value, wherein the ADC is coupled to receive a reference voltage from an emitter terminal of the first bipolar device;
an amplifier circuit configured to generate the bias voltage using a first voltage drop across the first bipolar device and a second voltage drop across a series combination of the bias resistor and the second bipolar device; and
a compensation circuit configured to adjust, based on a value of the bias resistor, a base current of the second bipolar device.

2. The apparatus of claim 1, further comprising a positive feedback loop including the first bipolar device and a negative feedback loop including the second bipolar device.

3. The apparatus of claim 1, wherein the compensation circuit is electrically coupled between a base terminal of the second bipolar device and a ground node.

4. The apparatus of claim 1, wherein the compensation circuit comprises a compensation resistor.

5. The apparatus of claim 4, wherein a current through a collector of the second bipolar device is dependent on a ratio of resistance of the bias resistor and the compensation resistor.

6. The apparatus of claim 4, wherein a spread of beta value, over temperature, between the second bipolar device and the first bipolar device is dependent on a ratio of resistance of the bias resistor and the compensation resistor.

7. The apparatus of claim 1, wherein the first, second, and third currents are proportional to absolute temperature (PTAT).

8. The apparatus of claim 1, wherein the compensation circuit is configured to reduce a spread of beta of the second bipolar device as temperature varies.

9. The apparatus of claim 1, wherein an emitter of the first bipolar device is electrically coupled to an inverting input of the amplifier circuit, and wherein an emitter of the second bipolar device is electrically coupled to a first terminal of the bias resistor, wherein a second terminal of the bias resistor is electrically coupled to a non-inverting input of the amplifier circuit.

10. The apparatus of claim 1, further comprising a temperature sensor, the temperature sensor including the first and second bipolar devices, the amplifier circuit, the current source, and the compensation circuit and further including:
a correction circuit configured to perform a linear correction to the first digital value to generate a second digital value indicative of a sensed temperature.

11. A method comprising:
generating, in a current source and using a bias voltage, a first current and a second current, and a third current;
sinking the first current using a first bipolar device;
sinking the second current using a second bipolar device;
generating a difference voltage, using a first resistor, based on the third current, wherein the difference voltage corresponds to a difference in a base-emitter voltage of the first bipolar device and a base-emitter voltage of the second bipolar device;
generating a first digital value, wherein generating the first digital value comprises using an analog-to-digital converter (ADC) converting the difference voltage into the first digital value and further comprises the ADC receiving a reference voltage from an emitter terminal of the first bipolar device;
generating the bias voltage using a first voltage drop across the first bipolar device and a second voltage drop across a series combination of a bias resistor and the second bipolar device, wherein generating the bias voltage is performed using an amplifier circuit; and
adjusting, using a compensation circuit and based on a value of the bias resistor, a base current of the second bipolar device.

12. The method of claim 11, further comprising:
generating positive feedback in a first feedback loop including the first bipolar device; and
generating negative feedback in a second feedback loop including the second bipolar device.

13. The method of claim 11, wherein the compensation circuit comprises a compensation resistor, and wherein the method further includes controlling a current through a collector of the second bipolar device based on a ratio of resistance of the bias resistor to a resistance of the compensation resistor.

14. The method of claim 11, wherein the method further comprises controlling, using the compensation circuit, a spread of a beta value of the second bipolar device.

15. The method of claim 11, further comprising generating the first, second, and third currents as proportional to absolute temperature (PTAT) currents based on the bias voltage generated by the amplifier circuit.

16. A system comprising:
a plurality of temperature sensors, wherein ones of the plurality of temperature sensors include:
a first bipolar device configured to sink a first proportional to absolute temperature (PTAT) current;
a second bipolar device configured to sink a second PTAT current, via a bias resistor;
an amplifier configured to generate a bias voltage using a first voltage drop across the first bipolar device and a second voltage drop across the bias resistor and second bipolar device;
a current source configured to generate the first, the second PTAT current, and a third PTAT current using the bias voltage;
a first resistor coupled between the current source and a ground node and configured to generate a difference voltage based on the third current, wherein the difference voltage corresponds to a difference between a base-emitter voltage of the first bipolar device and a base-emitter voltage of the second bipolar device;
an analog-to-digital converter (ADC) configured to convert the difference voltage into a first digital value, wherein the ADC is coupled to receive a reference voltage from an emitter terminal of the first bipolar device; and a compensation circuit coupled to a base terminal of the second bipolar device, wherein the compensation circuit is configured to control, over a range of temperatures, a spread of a beta value of the second bipolar device by adjusting a current on the base terminal.

17. A system of claim 16, wherein an emitter of the first bipolar device is electrically coupled to an inverting input of the amplifier, and wherein an emitter of the second bipolar device is electrically coupled to a first terminal of the bias resistor, wherein a second terminal of the bias resistor is electrically coupled to a non-inverting input of the amplifier.

18. The system of claim 16, wherein the compensation circuit comprises a compensation resistor electrically coupled between the base terminal of the second bipolar device and a ground node, and wherein the spread of beta value and the current through a collector terminal of the second bipolar device are dependent on a ratio of resistance of the bias resistor to a resistance of the compensation resistor.

19. The system of claim 16, wherein the first bipolar device and the amplifier form a positive feedback loop, and wherein the second bipolar device, the amplifier, the bias resistor, and the compensation circuit form a negative feedback loop.

20. The system of claim 16, wherein the ones of the temperature sensors further include:

a correction circuit configured to perform linearity correction on the first digital value to generate a second digital value indicative of a sensed temperature.

* * * * *